United States Patent
Chen et al.

(10) Patent No.: US 6,287,486 B1
(45) Date of Patent: Sep. 11, 2001

(54) NON-DESTRUCTIVE TECHNIQUE TO POLE BATIO₃ CRYSTAL

(75) Inventors: Jyh-Chen Chen; Yeou-Chang Lee, both of Chung-Li (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/321,536

(22) Filed: May 28, 1999

(51) Int. Cl.⁷ .................................................. B29D 11/00
(52) U.S. Cl. .................. 264/1.21; 264/1.36; 264/435; 264/442; 264/2.7
(58) Field of Search ..................... 264/1.1, 1.27, 264/435, 436, 442, 443, 1.21, 1.36, 2.7, 162

(56) References Cited

U.S. PATENT DOCUMENTS 3,306,835 * 2/1967 Magnus ................................. 264/436

OTHER PUBLICATIONS

Jpn. J. Appl. Phys., vol. 31, Nakao et al, "Influence of Poling Conditions . . . ", Part I, No. 9B, Sept. 1992, pp. 3117–3119.
Ferroelectrics, vol. 120, Garrett et al, "A Method for Poling Barium Titanate BaTiO₃", 1991, pp. 167–173.
Appl. Phys. Lett. 61 (18), Ito et al, "Observation of the photorefractive effect . . . ", Nov. 2, 1992, pp. 2144–2146.

* cited by examiner

Primary Examiner—Mathieu D. Vargot
(74) Attorney, Agent, or Firm—Jacobson Price, PLLC

(57) ABSTRACT

The structure of the barium titanate changes from cubic to tetragonal when the cooling temperature passes through the Curie temperature. This cooling process induces 90° and 180° domains in the crystal. The 90° domains, especially, are difficult to eliminate. In the present invention of this technique, the crystal is vibrated to release and dissipate the stress in the crystal, and pressed in the a-axis direction of the crystal. The vibrating contact cumulates the strength and differs from a continual press such as in the uniaxial pressure method. Consequently, only a slight force is needed to re-orient the domains, and thus eliminate the 90° domains.

6 Claims, 3 Drawing Sheets

NON-DESTRUCTIVE TECHNIQUE TO POLE BATIO₃ CRYSTAL

BACKGROUND OF THE INVENTION

1. Field of the Invention

The non-destructive technique to pole $BaTiO_3$ crystal calls for a slight stress to force the domains to re-orient, which then eliminates the 90° domains in the crystal. By adjusting the voltage and frequency this method may can be applied to the lump crystals of $BaTiO_3$.

In the solidification process of $BaTiO_3$, the temperature continues to fall. When the temperature drops to Curie Temperature (about 130° C.), the crystal structure will change from cubic to tetragonal, and the corresponding point group from 3 mm to 4 mm. In the crystal's changing process, the barium and titanium atoms displace position opposite to the oxygen atoms in the [001] direction. The movement will force the titanium atom, originally situated at the center of $TiO_6^{-8}$ octagon, to deviate towards a certain oxygen atom's position, resulting in the positive and negative atoms' gravity center to fall on different points in producing dipole moment. At the same time, the direction movement also creates a spontaneous polarization, endowing the crystal with ferroelectric effect. However, since the polarization may be oriented in any of the six pseudodoubic [001] directions of the cubic structure, in the cooling process of crystal, crystals at the different positions will have varied polarization directions, leading to the domains of the entire crystal under room temperature to be non-single domain. It forms the 90° and 180° domains 1, 2 as shown in FIG. 1. In the 90° domains 2, the c-axis of each domain is vertical with each other; therefore the reflection indices in the same direction are inconsistent, resulting in scattering when light passes the crystal. Consequently, the 90° domains 2 can be easily seen as shown in FIG. 2. Nonetheless, for 180° domains, the c-axis in each domain is antiparallel with each other. Thus, unless an etching method is used to reveal different degrees of etching for the positive and the negative domains, it is not discernible by sight.

2. Description of the Prior Art

As the 90° domains 2 in the crystal scatter the light and the 180° domains offset the electro-optic effect, the efficacy of optical experiments is considerably reduced. Consequently, before conducting optical test, it is imperative to turn these multi-domains into a single one. The customary method for eliminating 180° domains 1 is to apply an electric field to the c-face of a BaTio₃ with temperature slightly below the curie point. In terms of the 90° domains 2, three methods are available presently for the elimination. One of which is uniaxial pressure. The method administers pressure to the a-axis of the crystal, forcing the domain walls to move towards the crystal surface. The crystal surface can be polished to remove the multiple domains on the outer layer, as the 90° domains 2 generally cannot be completely eliminated by one pressure. The step has to be repeated until all 90° domains are removed, which wears off the crystal.

Moreover, the pressure administered must be great. In 1992, NaKao, et al. (Jpn. J. Appl. Phys. Vol. 31, Pt. 1-9B, pp. 3117), the pressure reported was as high as $2 \times 10^7$ Newton/$m^2$. Thus, once a crystal contains any internal flaw, the crystal is likely to fracture, especially for crystals with a diameter of less than 1 mm. A little force will break the crystal into little pieces. This makes the uniaxial method inappropriate for the current materials.

Furthermore, in 1991, Garrett, et. al. (Ferroelectrics, Vol. 120, pp. 167) had also used immersed etching to remove the 90° domains 2. The concept of the method arises from using acidic solution to remove the strain layer of the crystal surface created by machine cutting and polishing (The layer is likely to impede domain movement). This enables electrical poling to easily move the atom position, and along with electric field direction, turn it into a single domain. The advantage of the method is that it does not require great stress, and eliminates the occurrence of a flaw in the crystal. However, during the corrosion process, the crystal surface is worn off and turned coarse, making it not suitable for a crystal fiber.

In 1992, F. Ito (Appl. Phys. Lett. Vol. 6131-18, pp. 2144) proposed another method to eliminate the 90° domains. The method is quite simple. It calls for placing crystal on the electrodes, and subjecting it to high voltage for tens of hours. The greatest advantage of the method is its capacity to turn both 90° and 180° domains to a single domain. The drawback is that the 90° domain walls are difficult to move, and therefore difficult to eradicate completely. From the above description, it is evident that the elimination of 90° domains has been a problematic issue for the field.

SUMMARY OF THE INVENTION

The new technique proposes using a high-frequency vibration theory to remove the internal stress of the crystal, and incorporating this with uniaxial pressure to use slight stress for achieving the goal of eliminating 90° domains.

The non-destructive technique to pole $BaTiO_3$ crystal comprises the following steps:
a) The cut $BaTiO_3$ crystal is subjected to polishing liquid to polish the two ends of the crystal;
b) Use oscillation transducer to push against the crystal, and secure the other end;
c) Turn on oscillation transducer to produce ultrasonic vibration, and administer to the crystal for removing the 90° domains.

The oscillation transducer is made of two piezoelectric materials and a steeped horn; the length of the crystal is 3 to 5 mm, and set against the crystal's a-axis and negative a-axis direction. The ultrasonic vibration is produced by function generator, generating tens of thousand hertz of ultrasonic frequency; and an amplifier enlarges the voltage discharged by the function generator to tens of volts.

The characteristic of the new technique is that it is a non-destructive, repetitious vibration theory to administer pressure onto the crystal's a-axis direction for the release and dissipation of the stress of the domain movement, and drives the movement of the atoms at the same time. The reciprocal force is different from the customary uniaxial pressure method that administer continual pressure to the crystal for cumulating the forces produced. Consequently, only slight stress is required to force the domains to re-orient, and thus eliminate the 90° domains.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

REFERENCE NUMBER OF THE ATTACHED DRAWINGS

1 . . . 180° Domains
2 . . . 90° Domains
3 . . . Oscillation Transducer
4 . . . Crystal
5 . . . Piezoelectric Materials
6 . . . Function Generator
7 . . . High Frequency Amplifier

DETAILED DESCRIPTION OF THE INVENTION

The new technique is a non-destructive technique to pole $BaTiO_3$ crystal. The non-destructive method pertains to using a high frequency vibration theory to release the crystal's internal stress. The formation of 90° domains is mainly due to the varied directional movements of atoms when the cubic $BaTiO_3$ crystal passes through the Curie point. Consequently, if the atoms can be re-arrayed, the 90° domains 2 can be eradicated. However, the thermal stress induced by the temperature gradients during the crystal growth and the mechanical stress produced during the process of crystal cutting, polishing will impede the domain wall movement, resulting in incomplete elimination of the 90° domains 2. The new technique applies repetitious vibration to release, dissipate the stress that impedes the domain wall movement, and administer pressure on the crystal's 4 a-axis direction to drive the movement of the atoms. The reciprocal force is different from the customary uniaxial pressure method that administer continual pressure to the crystal 4 for cumulating the forces produced and maintaining the crystal 4 in vibrating state. Consequently, only slight stress is required to force the domains 1, 2 to re-orient, and thus eliminate the 90° domains 2. The characteristic of the new technique is that the slight stress will not damage the crystal 4, and will not wear the crystal 4 throughout the entire process which varies from the customary destructive pole method.

Figure 3:
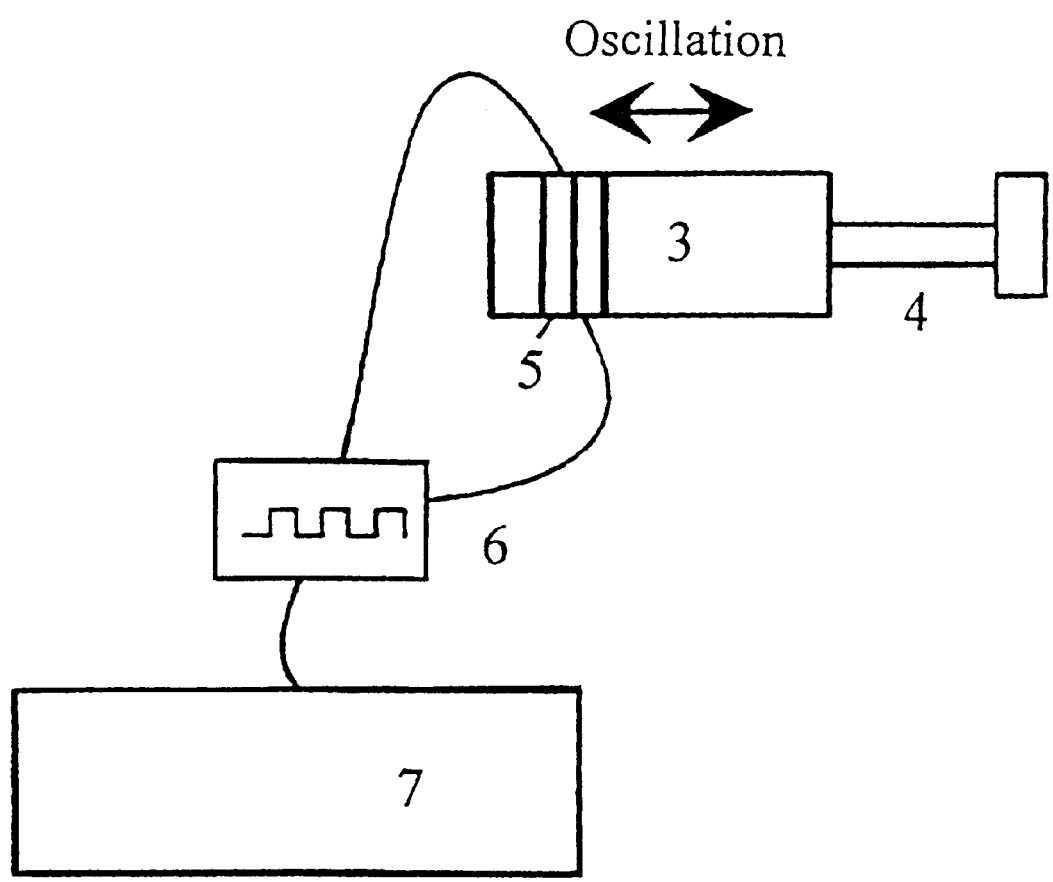
FIG. 3 illustrates a block diagram of the equipment used in the present invention.

The equipment used for the non-destructive technique to pole $BaTiO_3$ crystal 4 is as shown in FIG. 3. The crystal 4 used is $BaTiO_3$ fiber which is produced by a laser heated pedestal growth method, and cut into 3 to 5 mm by a diamond cutter. Furthermore, 3 μm and 1 μm of aluminum oxide solution are used to polish the two ends of the cut crystal 4. Once the crystal 4 sample is completed, the oscillation transducer 3 is used to produce vibration, and then pressed against the two sides of the crystal to produce oscillation. At the same time, pressure is administered in a-axis direction to achieve the goal of eliminating the 90° domains 2. If the crystal 4 growth direction is a-axis, the crystal 4 needs only be cut, polished and then the oscillation transducer 3 is set on the two ends of the crystal. If the crystal growth direction is c-axis, it is more difficult to tell the a-axis direction of the round crystal fibers. At this time, the crystal direction is rotated, and the transducer 3 is used to test different angles which can also eradicate the 90° domains.

Figure 1:
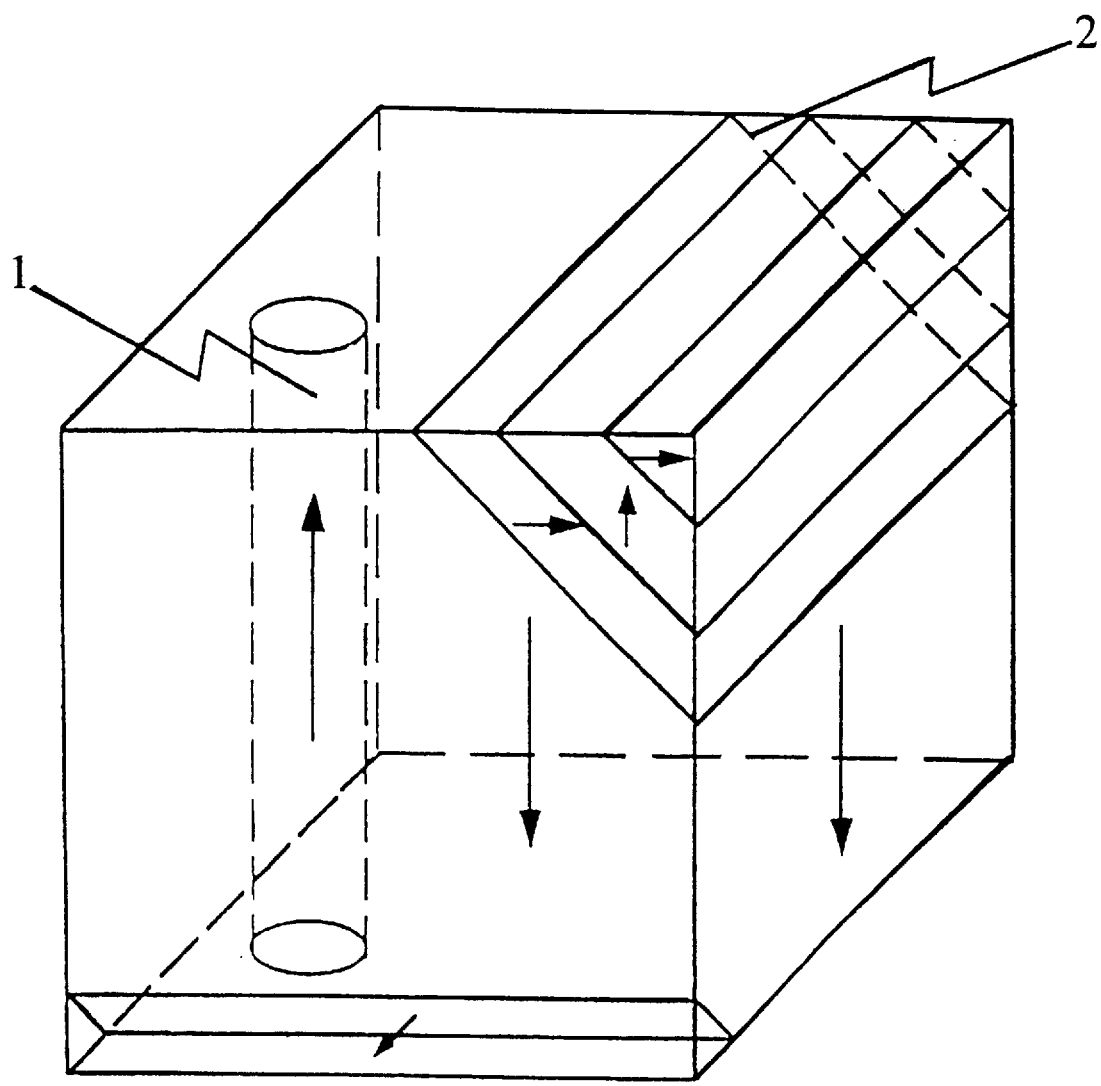
FIG. 1 illustrates multi-domain $BaTiO_3$ as set forth in the present invention.
Figure 2:
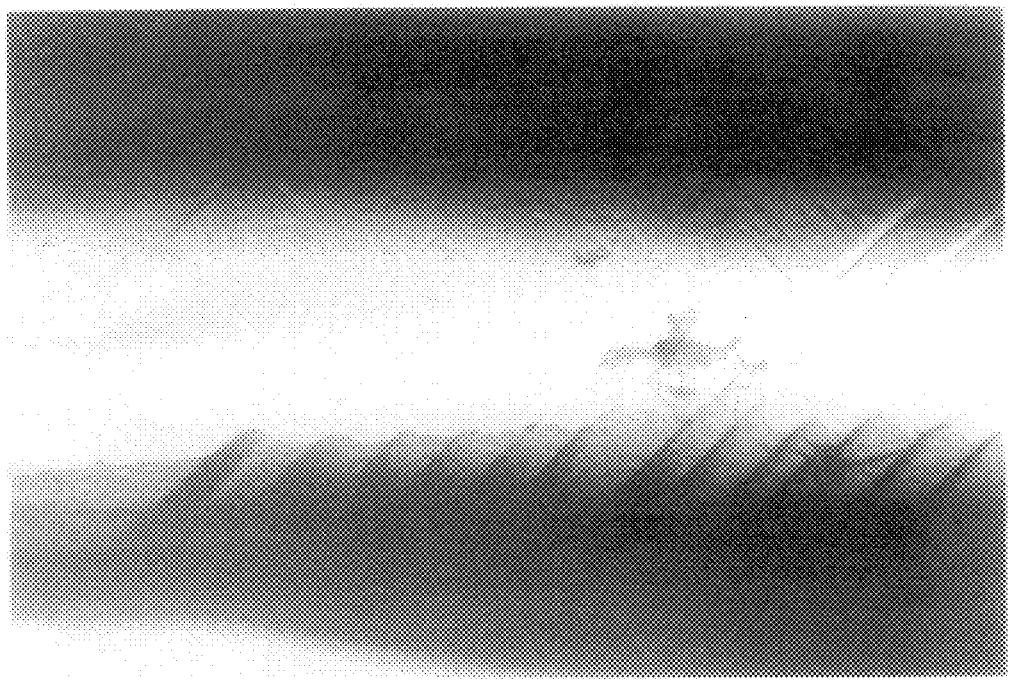
FIG. 2 shows a photograph of 90° domains according to the present invention.
Figure 4:
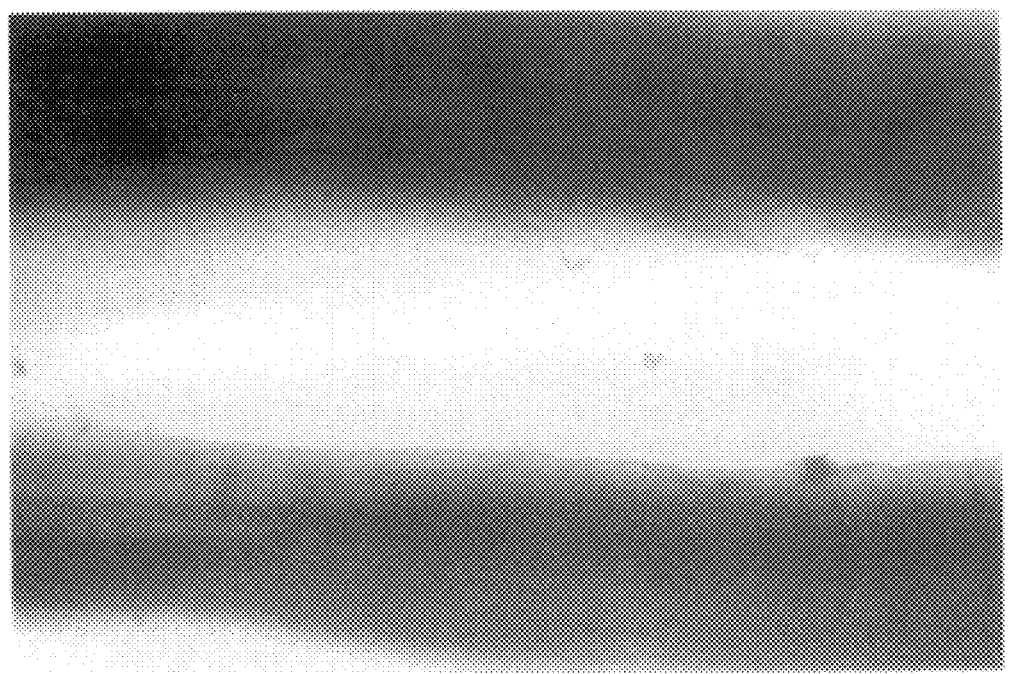
FIG. 4 is a photograph of a poled crystal from FIG. 2 as viewed through a microscope.

The vibrating frequency is determined by the driven frequency of the piezoelectric materials 5. The frequency used in the experiment is tens of thousand hertz. Therefore, the driving device must be connected to the function generator 6. If the voltage generated by the function generator 6 is far too low, it has to be connected to the high frequency amplifier, and the voltage adjusted to produce different vibration scales of tens of thousand hertz. Generally speaking, the level of 60 volts is able to eradicate the 90° domains 2. Given the simplicity of the method, real-time observation can be made through a microscope. FIG. 4 is a photograph of the poled crystal from FIG. 2 taken through the microscope, which shows that the 90° domains have been completely eliminated.

The new technique applies vibration to eliminate the 90° domains 2. The process of which calls for only slight stress to create atom movement, and thus avoids the damages to crystal 4 produced by the customary measure of high pressure. The new technique also saves material consumption during crystal processing as well as work time. Under different voltages and frequencies, the new technique can also be applied to a lump of $BaTiO_3$ crystal.

The invention being thus described, it will be evident that the same may be varied in many ways. Such variations are not to be regarded as a departure from the spirit and scope of the invention, and all such modifications as would be recognized by one skilled in the art are intended to be included within the scope of the following claims.

What is claimed is:

1. A non-destructive technique to pole $BaTiO_3$ crystal and eliminate 90° domains formed in said crystal, said technique comprising the following steps:

cutting a $BaTiO_3$ crystal so that two ends are formed;

subjecting said crystal to a polishing liquid;

polishing the two formed ends of the crystal;

pushing an ultrasonic oscillation transducer against one of the formed ends of the crystal;

securing the other formed end of said crystal;

turning on said ultrasonic oscillation transducer to produce ultrasonic vibration; and administering said produced ultrasonic vibration to said crystal for removing the 90° domains.

2. The method accorded to claim 1, wherein the oscillation transducer is made of piezoelectric materials and stepped horn.

3. The method accorded to claim 1, wherein the crystal length is 3 to 5 mm.

4. The method accorded to claim 1, wherein the ultrasonic oscillation transducer is set against the crystal so as to be in the crystal's a-axis and negative a-axis directions.

5. The method accorded to claim 1, wherein said oscillation transducer provides said ultrasonic vibration with ultrasonic frequency waves of tens of thousand hertz.

6. The method accorded to claim 1, further comprising the steps of;

providing a high frequency amplifier;

providing a function generator for discharging voltage; and enlarging the discharge voltage of said function generator to tens of volts with said high frequency amplifier.

* * * * *